(12) United States Patent
Lim et al.

(10) Patent No.: US 9,809,448 B2
(45) Date of Patent: Nov. 7, 2017

(54) SYSTEMS AND APPARATUS HAVING MEMS ACOUSTIC SENSORS AND OTHER MEMS SENSORS AND METHODS OF FABRICATION OF THE SAME

(71) Applicant: INVENSENSE, INC., San Jose, CA (US)

(72) Inventors: Martin Lim, San Mateo, CA (US); Fariborz Assaderaghi, Emerald Hills, CA (US)

(73) Assignee: INVENSENSE, INC., San Jose, CA (US)

( * ) Notice: Subject to any disclaimer, the term of this patent is extended or adjusted under 35 U.S.C. 154(b) by 96 days.

(21) Appl. No.: 14/618,251

(22) Filed: Feb. 10, 2015

(65) Prior Publication Data

US 2015/0158722 A1    Jun. 11, 2015

Related U.S. Application Data

(63) Continuation-in-part of application No. 14/174,639, filed on Feb. 6, 2014, now Pat. No. 9,428,379, which
(Continued)

(51) Int. Cl.
*H01L 29/82* (2006.01)
*B81B 7/00* (2006.01)
(Continued)

(52) U.S. Cl.
CPC .............. *B81B 7/0061* (2013.01); *B81B 7/02* (2013.01); *G01L 23/125* (2013.01);
(Continued)

(58) Field of Classification Search
CPC ............................ H04R 19/005; B81B 3/0086
See application file for complete search history.

(56) References Cited

U.S. PATENT DOCUMENTS

| 4,495,385 A | 1/1985 | Roberts et al. |
| 4,524,247 A | 6/1985 | Lindenberger et al. |

(Continued)

FOREIGN PATENT DOCUMENTS

| CN | 101437188 A | 5/2009 |
| CN | 102067433 A | 5/2011 |

(Continued)

OTHER PUBLICATIONS

Leinenbach, et al., "A New Capacitive Type MEMS Microphone," 2010, pp. 659-662, IEEE.
(Continued)

*Primary Examiner* — Samuel Gebremariam
(74) *Attorney, Agent, or Firm* — Amin, Turocy & Watson, LLP

(57) ABSTRACT

A micro electro-mechanical system (MEMS) device is provided. The MEMS device includes: a substrate having a first surface and a second surface and wherein the first surface is exposed to an environment outside the MEMS device; and a MEMS microphone disposed at a first location on the second surface of the substrate and having a diaphragm positioned such that acoustic waves received at the MEMS microphone are incident on the diaphragm. The MEMS device also includes: a first integrated circuit disposed at a second location of the substrate, wherein the first integrated circuit is electrically coupled to the MEMS microphone; and a MEMS measurement device at a third location, wherein the MEMS measurement device comprises a motion sensor and a pressure sensor.

16 Claims, 16 Drawing Sheets

Related U.S. Application Data is a continuation of application No. 13/800,061, filed on Mar. 13, 2013, now Pat. No. 8,692,340.

(51) Int. Cl.
    *G01L 23/12*     (2006.01)
    *H04R 19/00*     (2006.01)
    *B81B 7/02*     (2006.01)

(52) U.S. Cl.
    CPC ...... *H04R 19/005* (2013.01); *B81B 2201/025* (2013.01); *B81B 2201/0257* (2013.01); *B81B 2201/0264* (2013.01); *B81B 2207/012* (2013.01)

(56) References Cited

U.S. PATENT DOCUMENTS

| | | | |
|---|---|---|---|
| 4,533,795 | A | 8/1985 | Baumhauer, Jr. et al. |
| 4,558,184 | A | 12/1985 | Busch-Vishniac et al. |
| 6,136,630 | A | 10/2000 | Weigold et al. |
| 6,429,458 | B1 | 8/2002 | Weigold et al. |
| 7,434,305 | B2 | 10/2008 | Minervini |
| 7,449,356 | B2 | 11/2008 | Weigold |
| 7,795,063 | B2 | 9/2010 | Hsieh et al. |
| 7,933,428 | B2 | 4/2011 | Sawada |
| 7,951,636 | B2 | 5/2011 | Lee et al. |
| 7,989,889 | B1 * | 8/2011 | Kerr ............... H01L 29/1045 257/335 |
| 8,045,734 | B2 | 10/2011 | Zhe et al. |
| 2007/0047746 | A1 | 3/2007 | Weigold et al. |
| 2007/0064968 | A1 | 3/2007 | Weigold |
| 2007/0082421 | A1 | 4/2007 | Minervini |
| 2007/0087466 | A1 | 4/2007 | Weigold et al. |
| 2007/0092983 | A1 | 4/2007 | Weigold |
| 2007/0165888 | A1 | 7/2007 | Weigold |
| 2008/0123878 | A1 | 5/2008 | Zhe et al. |
| 2008/0175418 | A1 | 7/2008 | Zhang et al. |
| 2008/0267431 | A1 | 10/2008 | Leidl et al. |
| 2009/0029501 | A1 | 1/2009 | Weigold |
| 2009/0086999 | A1 | 4/2009 | Song et al. |
| 2009/0166772 | A1 | 7/2009 | Hsieh et al. |
| 2009/0179233 | A1 | 7/2009 | Lee et al. |
| 2009/0278217 | A1 | 11/2009 | Laming et al. |
| 2009/0285419 | A1 | 11/2009 | Shih et al. |
| 2009/0309171 | A1 | 12/2009 | Schrank |
| 2009/0316916 | A1 | 12/2009 | Haila et al. |
| 2010/0052082 | A1 | 3/2010 | Lee et al. |
| 2010/0067728 | A1 | 3/2010 | Chen |
| 2010/0092020 | A1 | 4/2010 | Ryan et al. |
| 2010/0155864 | A1 | 6/2010 | Laming et al. |
| 2010/0158279 | A1 | 6/2010 | Conti et al. |
| 2010/0158280 | A1 | 6/2010 | Coronato et al. |
| 2010/0264499 | A1 * | 10/2010 | Goodelle ............ B81C 1/00333 257/416 |
| 2010/0277229 | A1 | 11/2010 | Lee et al. |
| 2010/0283138 | A1 * | 11/2010 | Chen ................. B81C 1/00269 257/678 |
| 2010/0330722 | A1 | 12/2010 | Hsieh et al. |
| 2011/0048131 | A1 | 3/2011 | Reinmuth |
| 2011/0104844 | A1 | 5/2011 | Hsieh et al. |
| 2011/0189804 | A1 | 8/2011 | Huang et al. |
| 2011/0210409 | A1 | 9/2011 | Minervini |
| 2011/0280419 | A1 | 11/2011 | Kasai |
| 2011/0311081 | A1 | 12/2011 | Kim |

FOREIGN PATENT DOCUMENTS

| | | |
|---|---|---|
| EP | 1384612 A2 | 1/2004 |
| EP | 2299584 A1 | 3/2011 |
| WO | 03055271 | 7/2003 |
| WO | 2010119415 | 10/2010 |

OTHER PUBLICATIONS

Nadal-Guardia, et al., "AC Transfer Function of Electrostatic Capacitive Sensors Bases on the 1-D Equivalent Model: Application to Silicon Microphones," Journal of Micro Electromechanical Systems, Dec. 2003, pp. 972-978, vol. 12, No. 6.

Fuldner, et al., "Analytical Analysis and Finite Element Simulation of Advanced Membranes for Silicon Microphones," IEEE Sensors Journal, Oct. 2005, pp. 857-863, vol. 5, No. 5.

Fuldner, et al., "Challenges of High SNR (Signal-To-Noise) Silicon Micromachined Microphones," 19th International Congress on Acoustics, Madrid, Sep. 2007, pp. 1-6.

Nadal-Guardia, et al., "Constant Charge Operation of Capacitor Sensors Based on Switched-Current Circuits," IEEE Sensors Journal, Dec. 2003, pp. 835-842, vol. 3, No. 6.

Feiertag, et al., "Flip Chip MEMS Microphone Package with Large Acoustic Reference Volume," Proc. Eurosensors XXIV, Sep. 2010, pp. 355-358, Elsevier Ltd., Linz, Austria.

Brauer, et al., "Improved Signal-to-Noise Ratio of Silicon Microphones by a High-Impedance Resistor," Journal of Micromechanics and Microengineering, Aug. 2004, pp. S86-S89, Institute of Physics Publishing.

Winter, et al., "Influence of a Chip Scale Package on the Frequency Response of a MEMS Microphone," Microsyst Technol, Dec. 2009, 7 Pages, Springer.

Bernstein, "MEMS Microphones at Draper MEMS Air Acoustics Research The Charles Stark Draper Laboratory," Aug. 1999, pp. 1-8.

Veijola, "Nonlinear Circuit Simulation of MEMS Components: Controlled Current Source Approach," Proceedings of ECCTD'01, Aug. 2001, pp. 377-380, vol. 3, Espoo, Finland.

Brauer, et al., "Silicon Microphone Based on Surface and Bulk Micromachining," Journal of Micromechanics and Microengineering, 2001, pp. 319-322, Institute of Physics Publishing.

Dehe, "Silicon Microphone Development and Application," Sensors and Actuators, 2006, pp. 283-287, Elsevier.

Zinserling, "Silicon-Based MEMS Microphone for Automotive Applications," MicroNano News, Feb. 2007, pp. 8-11.

Kasai, et al., "Small Silicon Condenser Microphone Improved With a Backchamber With Concave Lateral Sides," Transducers & Eurosensors 2007, The 14th International Conference on Solid-State Sensors, Actuators and Microsystems, Jun. 2007, pp. 2613-2616, Lyon, France.

Notice of Allowance dated Nov. 20, 2013 for U.S. Appl. 13/800,061, 10 pages.

International Search Report and the Written Opinion for International Application No. PCT/US2014/019685, mailed Jun. 10, 2014.

* cited by examiner

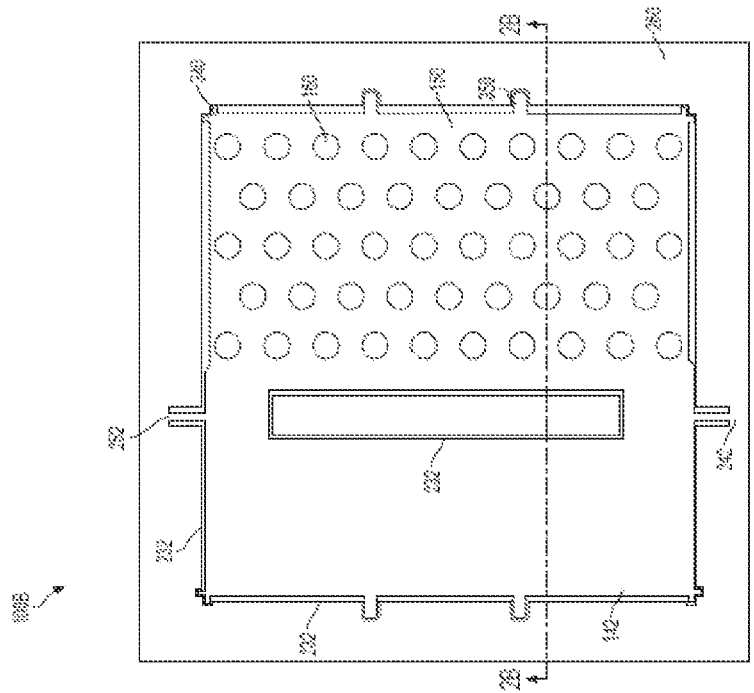
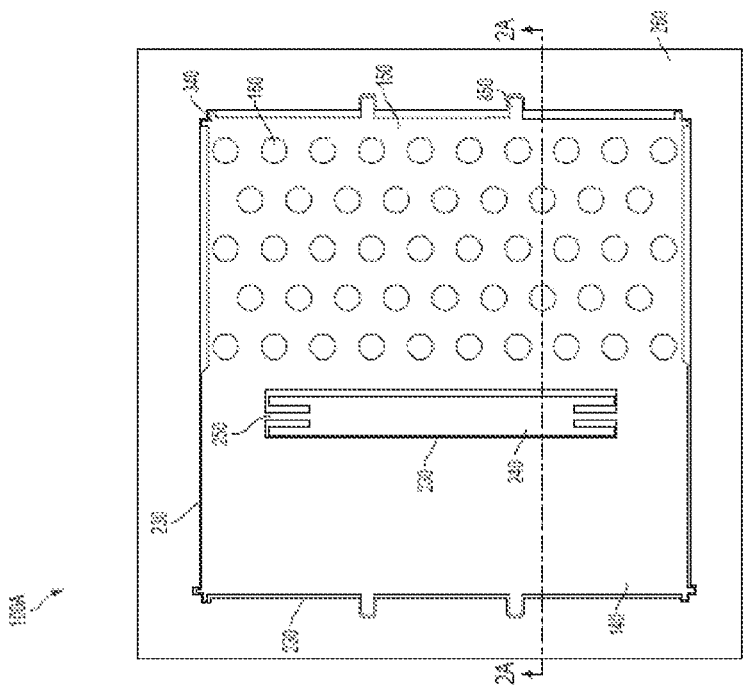

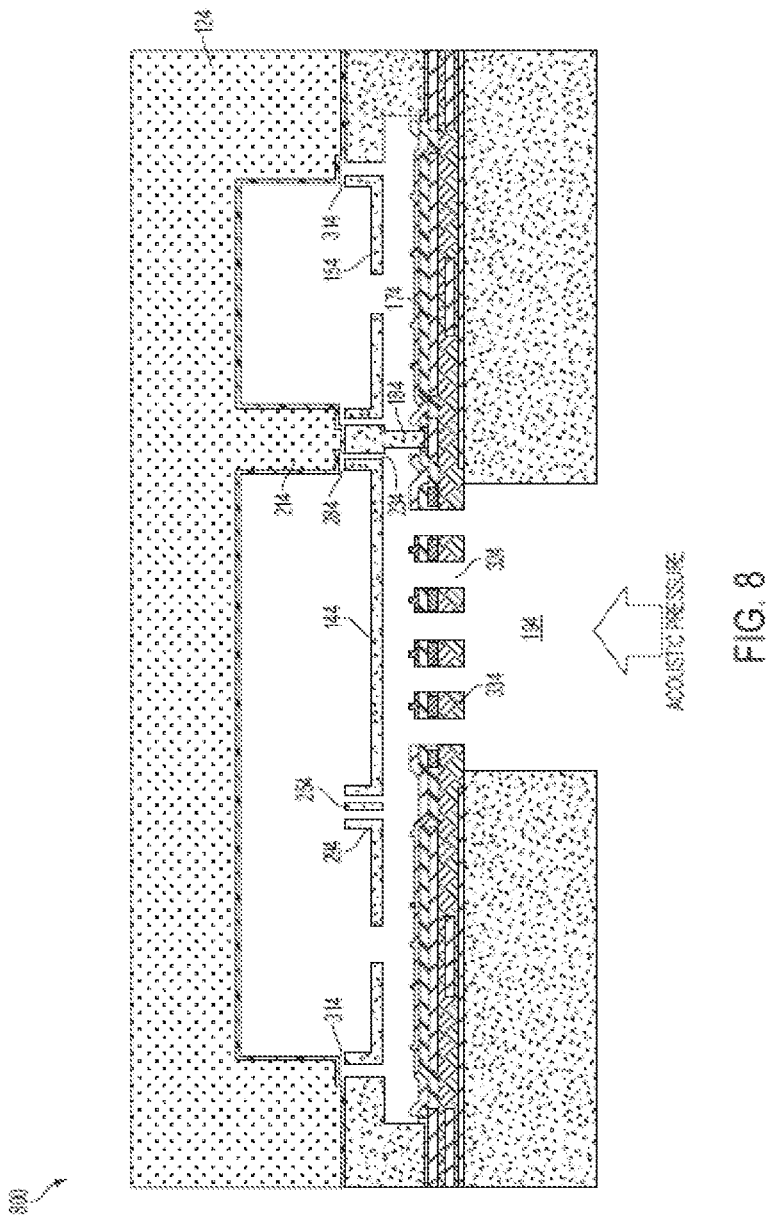

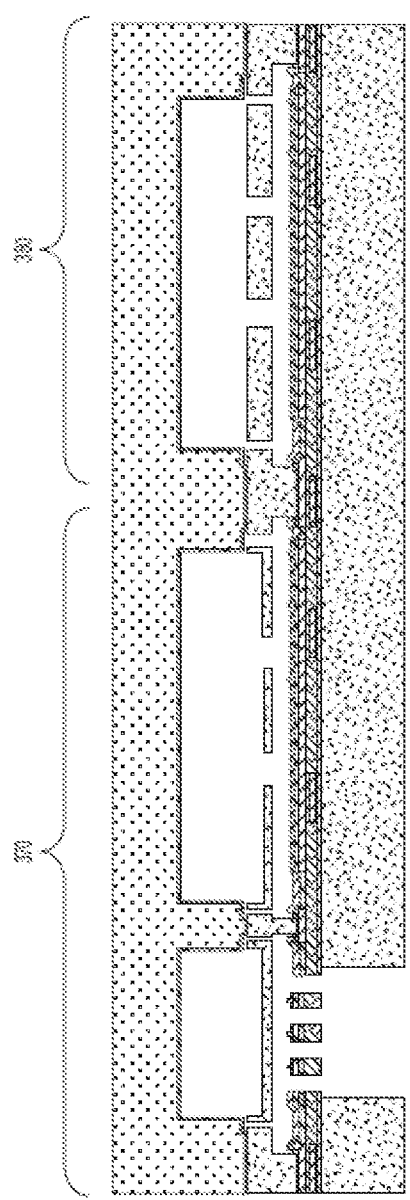

SYSTEMS AND APPARATUS HAVING MEMS ACOUSTIC SENSORS AND OTHER MEMS SENSORS AND METHODS OF FABRICATION OF THE SAME

CROSS-REFERENCE TO RELATED APPLICATIONS

This application is a continuation-in-part of U.S. application Ser. No. 14/174,639, filed Feb. 6, 2014 and titled "MEMS Acoustic Sensor With Integrated Back Cavity," which is a continuation of U.S. application Ser. No. 13/800,061 (now U.S. Pat. No. 8,692,340), filed Mar. 13, 2013 and titled "MEMS Acoustic Sensor With Integrated Back Cavity," the entireties of each of which are incorporated herein by reference.

TECHNICAL FIELD

Embodiments of the subject disclosure relate generally to micro electro-mechanical system (MEMS) microphones, and particularly to apparatus including combination MEMS microphones and inertial sensors.

BACKGROUND

Most commercially available MEMS microphones or silicon microphones are formed by two chips, an application specific integrated circuit (ASIC) chip and a MEMS chip attached to a substrate. These chips are generally enclosed by a conductive cover or lid. An acoustic wave is provided from an opening on a top surface of the microphone or from an opening on the substrate. Typically, in commercial applications in which the acoustic wave is input from the top (e.g., cover or lid) of the device, an acoustic back cavity is formed mainly by a volume under the MEMS chip and the substrate. By contrast, in commercial applications in which the acoustic input is from the bottom (e.g., from the substrate), the acoustic cavity is typically formed by the volume enclosed by the substrate and the cover/lid.

SUMMARY

In one embodiment, a MEMS device includes: a substrate having a first surface and a second surface and wherein the first surface is exposed to an environment outside the MEMS device; and a MEMS microphone disposed at a first location on the second surface of the substrate and having a diaphragm positioned such that acoustic waves received at the MEMS microphone are incident on the diaphragm. The MEMS device also includes: an integrated circuit disposed at a second location of the substrate, wherein the integrated circuit is electrically coupled to the MEMS microphone; and a MEMS measurement device at a third location, wherein the MEMS measurement device includes a motion sensor.

In another embodiment, a MEMS device includes: a package having a port through the package and exposed to an environment; and a MEMS microphone disposed at a first location on a first surface within the package, wherein the MEMS microphone includes a diaphragm positioned such that acoustic waves received at the port of the package are incident on the diaphragm. The MEMS device also includes a MEMS detection structure enclosed within the package, wherein the MEMS detection structure includes: a processor provided at a second location on a surface of the package; an integrated circuit coupled to the processor; and a MEMS measurement device coupled to an integrated circuit, wherein the MEMS measurement device includes a three-axis accelerometer, a three-axis gyroscope and a pressure sensor.

In another embodiment, a method of fabrication of a micro electro-mechanical system (MEMS) device includes: providing a substrate having a first surface and a second surface and wherein the first surface is exposed to an environment outside the MEMS device; and providing a MEMS microphone disposed at a first location on the second surface of the substrate and having a diaphragm positioned such that acoustic waves received at the MEMS microphone are incident on the diaphragm. The method can also include providing an integrated circuit disposed at a second location on the second surface of the substrate, wherein the integrated circuit is electrically coupled to the MEMS microphone; and providing a MEMS measurement device disposed on the integrated circuit, wherein the MEMS measurement device includes a motion sensor.

In another embodiment, a system having a device and a MEMS device operably coupled to the device are provided. The device includes: a memory to store computer-executable instructions; and a processor coupled to the memory, that facilitates execution of the executable instructions to perform operations including receipt, from a MEMS device, of information indicative of acoustic waves. The operations include: receipt, from a MEMS device, of information indicative of acoustic waves representative of speech including a command; identification of the command; and performance of one or more functions based on the command. Other applications for acoustic wave sensing include voice activity detection, sound classification, speech recognition, and audio scene determination. Additional use include sensing of ultrasonic signals and their applications such as gesture recognition, proximity detection, range finding and ultrasonic communication The MEMS device includes: a package having a port through the package, exposed to an environment outside the package and configured to receive the acoustic waves; a MEMS microphone disposed at a first location on a first surface within the package, wherein the MEMS microphone includes a diaphragm positioned such that the acoustic waves received at the port of the package are incident on the diaphragm; and a MEMS detection structure enclosed within the package. The MEMS detection structure includes a MEM measurement device coupled to an integrated circuit, wherein the MEMS measurement device comprises a motion sensor and a pressure sensor.

In another embodiment, another MEMS device is provided. The MEMS device includes a substrate having a first surface and a second surface and wherein the first surface is exposed to an environment outside the MEMS device; and a MEMS microphone disposed at a first location on the second surface of the substrate and having a diaphragm positioned such that acoustic waves received at the MEMS microphone are incident on the diaphragm. The MEMS device also includes an integrated circuit disposed at a second location, wherein the integrated circuit is electrically coupled to the MEMS microphone; and a MEMS measurement device disposed at a third location, wherein the MEMS measurement device comprises a pressure sensor.

A further understanding of the nature and the advantages of particular embodiments disclosed herein can be realized by reference of the remaining portions of the specification and the attached drawings.

BRIEF DESCRIPTION OF THE DRAWINGS

The accompanying figures. illustrate several embodiments of the invention and, together with the description, serve to explain the principles of the invention. One of ordinary skill in the art readily recognizes that the particular embodiments illustrated in the figures are merely exemplary, and are not intended to limit the scope of the present invention.

FIGS. 1A and 1B show different embodiments of the top view of the device layer of a torsional microphone.

FIG. 8 shows alternative manufacturing options for a piston microphone.

FIG. 10 shows an example of integration of MEMS microphone with other MEMS device.

DETAILED DESCRIPTION

Figure 2A:
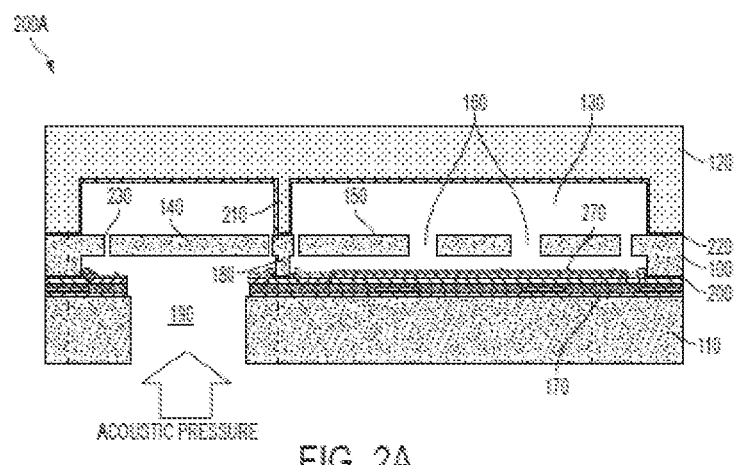
FIG. 2A shows the cross section of the torsional microphone with integrated back cavity along 2A-2A in FIG. 1A.

One or more of the embodiments described relates generally to MEMS devices, and more particularly, to a MEMS acoustic sensor such as a microphone. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

In the described embodiments, the term "MEMS" refers to a class of structures or devices fabricated using semiconductor-like processes and exhibiting mechanical characteristics such as the ability to move or deform. MEMS devices often, but not always, interact with electrical signals. MEMS devices include inertial sensors such as but are not limited to gyroscopes, accelerometers, magnetometers, and other sensors such as pressure sensors, microphones, resonator, temperature sensors, humidity sensors, gas sensors, and radio-frequency components. Silicon wafers containing MEMS structures are referred to as MEMS wafers. In the described embodiments, motion sensors typically include one or more gyroscopes or accelerometers measuring motion along one or more axes.

In the described embodiments, the MEMS device may refer to a semiconductor device implemented as a micro-electro-mechanical system. The MEMS structure may refer to any feature that may be part of a larger MEMS device. The semiconductor layer with the mechanically active MEMS structure is referred to as the device layer. An engineered silicon-on-insulator (ESOI) wafer may refer to a SOI wafer with cavities beneath the silicon device layer or substrate. A handle wafer typically refers to a thicker substrate used as a carrier for the thinner silicon device substrate in a silicon-on-insulator wafer. A handle substrate and a handle wafer can be interchanged.

In the described embodiments, a cavity may refer to an opening or recession in a substrate wafer and an enclosure may refer to a fully enclosed space. A post may be a vertical structure in the cavity of the MEMS device for mechanical support. A standoff is a vertical structure providing electrical contact.

In the described embodiments, a back cavity may refer to a partially enclosed cavity equalized to ambient pressure via Pressure Equalization Channels (PEC). In some embodiments, a back cavity is also referred to as a back chamber. A back cavity formed within the complementary metal oxide semiconductor (CMOS)-MEMS device can be referred to as an integrated back cavity. Pressure equalization channels, also referred to as venting or leakage channels/paths, are acoustic channels for low frequency or static pressure equalization of a back cavity to ambient pressure.

In the described embodiments, a rigid structure within a MEMS device that moves when subject to force may be referred to as a plate. Although rigid plates are preferred for the described embodiments, semi rigid plates or deformable membranes could replace rigid plates. Plates may comprise of silicon, silicon containing materials (e.g. poly-silicon, silicon oxide, silicon nitride), metals and materials that are used in semiconductor processes (e.g. aluminum nitride, germanium). A back plate may be a solid or perforated plate comprising at least one electrode. The electrode can be comprised of semiconductor process compatible conductive materials (e.g. poly-silicon, silicon, aluminum, copper, nickel, titanium, chromium, gold). The electrodes may have insulating films on one or more surfaces.

In the described embodiments, perforations refer to acoustic openings for reducing air damping in moving plates. An acoustic port may be an opening for sensing the acoustic pressure. An acoustic barrier may be a structure that prevents acoustic pressure from reaching certain portions of the device. Linkage is a structure that provides electrical conductivity and compliant attachment to a substrate through an anchor. Extended acoustic gap can be created by step etching of the post and creating a partial post overlap over the PEC. In-plane bump stops limit range of movement in the plane of the plate if the plates move more than desired (e.g. under a mechanical shock). Similarly rotational bump stop are extensions of the plate to limit the displacement normal to the plane due to out-of-plane rotation.

In the described embodiments, structures (plates) of MEMS device and electrodes formed on CMOS substrate form sensor capacitors. Sensor capacitors are electrically biased for detection of change of capacitance due to acoustic pressure.

To describe the features of the present invention in more detail, refer now to the following description in conjunction with the accompanying drawings.

FIGS. 1A and 1B show different embodiments of top views of device layers 100A and 100B of torsional microphone. FIGS. 1A and 1B illustrates a first plate 140, 142 that senses acoustic pressure on its first surface, and a second plate 150 with perforations 160 and a linkage 250, 252 attached to an anchor 240, 242. In an embodiment the first plate 140, 142 and second plate 150 are rigid. The difference between FIGS. 1A and 1B are the locations of linkages 250, 252. A different embodiment may include combination of linkages 250 and 252 resulting in four linkages, adding a central cutout portion to FIGS. 1A and 1B. The first plate 140, 142 is partially surrounded by a pressure equalization channel (PEC) 230, 232, and the device layer 100A, 100B is surrounded by a seal 260 to ensure that the only acoustical input to the device will be via an acoustic port 190 (in FIGS. 2A and 2B.

When a force is applied (acoustic pressure variation) on the first surface of first plate 140, 142, the first plate 140, 142 is rotationally displaced around an axis passing through linkages 250, 252, hence the second plate 150 is displaced in an opposite direction (rotational displacement around the same axis). The linkages 250, 252 form torsional restoring forces acting against movement and will bring the plates to their initial position once externally applied acoustic force is zero. Undesired in plane movements can be limited by introducing in plane bump stops 340 at locations where undesired movement/rotation has a high amplitude, e.g. furthest away from linkages 250, 252. The in plane bump stops 340 can be defined and manufactured on the second plate 150 or the device layer 100A, 100B or the first plate 140, 142 or any combination of these.

In an embodiment, protruding tabs that form rotational bump stops 350 are provided to limit the rotation of the first 140,142 and second plates 150. By proper design the rotational bump stops 350 may eliminate need for reduction or turning off the potential difference between first and second plates 140, 142 and 150, and the electrode 170 shown in FIGS. 2A and 2B for recovery from a tip-in or out of range condition.

Figure 2B:
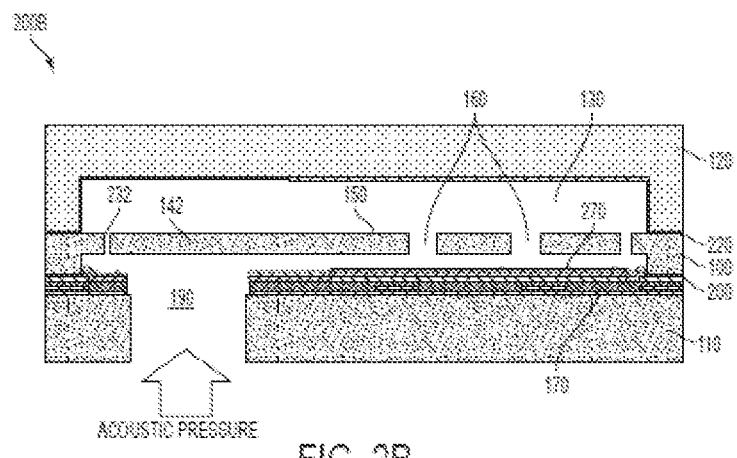
FIG. 2B shows the cross section of the torsional microphone with integrated back cavity along 2B-2B in FIG. 1B.

FIGS. 2A and 2B show the cross section of the torsional microphone 200A and 200B with integrated back cavity 130 along 2A-2A and 2B-2B in FIGS. 1A and B respectively. In an embodiment, integrated back cavity 130 is formed by a fusion bond 220 between the second substrate 120 and the device layer 100A and 100B which is further bonded to the first substrate 110 by conductive alloy (eutectic) bond 200 by processes as described in a commonly owned U.S. Pat. No. 7,442,570, entitled, "Method of Fabrication of a Al/Ge Bonding in a Wafer Packing Environment and a Product Produced Therefrom", which is incorporated herein by reference.

Static pressure in the back cavity 130 is equalized by ambient pressure via air flow through the PEC 230 and 232. Ideally, PEC 230 and 232, provide high resistance to air flow in the frequency range of interest (e.g. 100 Hz and above), and low resistance at lower frequencies down to static pressure changes. Linkages 250 are attached to standoffs 180 both mechanically and electrically. The standoffs 180 in an embodiment are lithographically defined protruding members of device layer that are mechanically and electrically connected to top conductive layers of the first substrate 110 via alloy or eutectic bonding. The device layer 100A and 100B in an embodiment is lithographically patterned to form the first plate 140, a second plate 150, with perforations 160, PEC 230,232 and an acoustic seal 260, around the active device.

The second plate 150 with perforations 160 forms a first electrode and is electrically connected to an integrated circuit (IC) manufactured on the first substrate 110, while a second electrode 170 is disposed on the first substrate 110. Second electrode 170 is aligned with the first electrode or second plate 150. A first surface of second plate 150 and the second electrode 170 form a variable capacitor whose value changes due to pressure being applied on a first surface of first plate 140.142. In an embodiment, additional material such as silicon nitride or silicon oxide is deposited on the second electrode 170. The additional material can be lithographically patterned to form bump stops 270 to reduce stiction force by reducing the contact area in the undesired event that first and/or second plate 140,142 and 150 come into contact with first substrate 110.

Figure 3A:
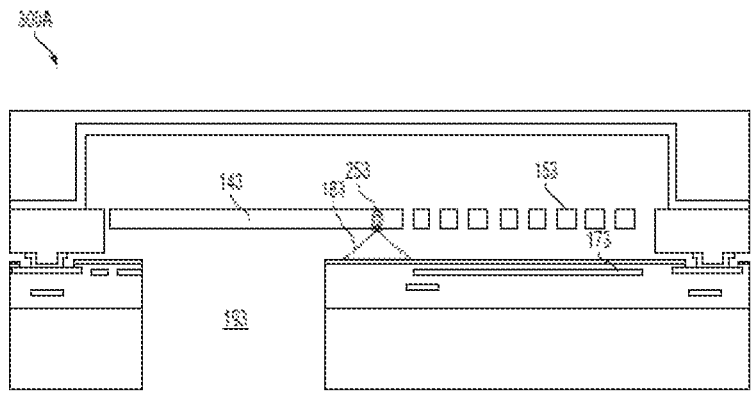
FIGS. 3A and 3B show the operation of the torsional microphone using a symbolic representation for the linkage with torsional compliance
Figure 3B:
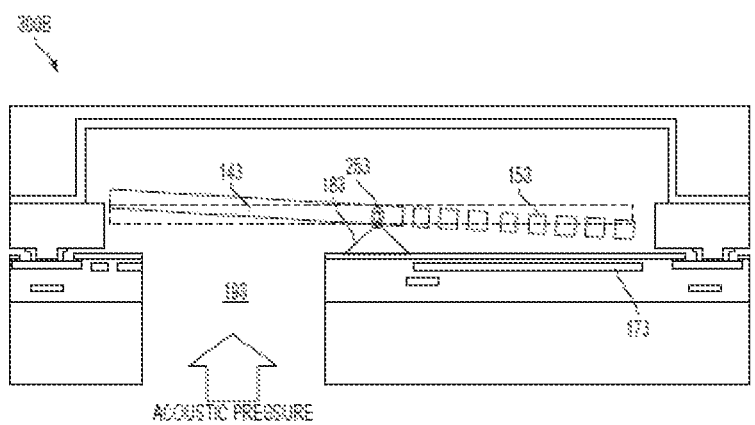

FIGS. 3A and 3B illustrate the conceptual design describing the operation of the torsional microphone of FIG. 2A or 2B with a symbolic anchor 183, and a symbolic torsional linkage 253.

Referring now to FIG. 3A, the acoustic port 193 is a channel in the first substrate 110 that allows acoustic pressure to reach the first surface of the first plate 143. Under an applied acoustic pressure, the first plate 143 rotates slightly either clockwise or counter-clockwise depending on polarity of acoustic pressure. In FIG. 3B, the case where the first plate 143 rotates in a clockwise direction around a rotation axis that coincides with linkage like structure 253 is depicted.

Rotational movement coupled to the perforated second plate 153 results in a reduced gap between first surface of the second plate 153 and a second electrode 173, hence the capacitance defined by these two surfaces increases. An IC manufactured on the first substrate 110 is electrically connected to both the second plate 153 and second electrode 173 detects the change in capacitance proportional to the acoustic pressure.

Figure 4:
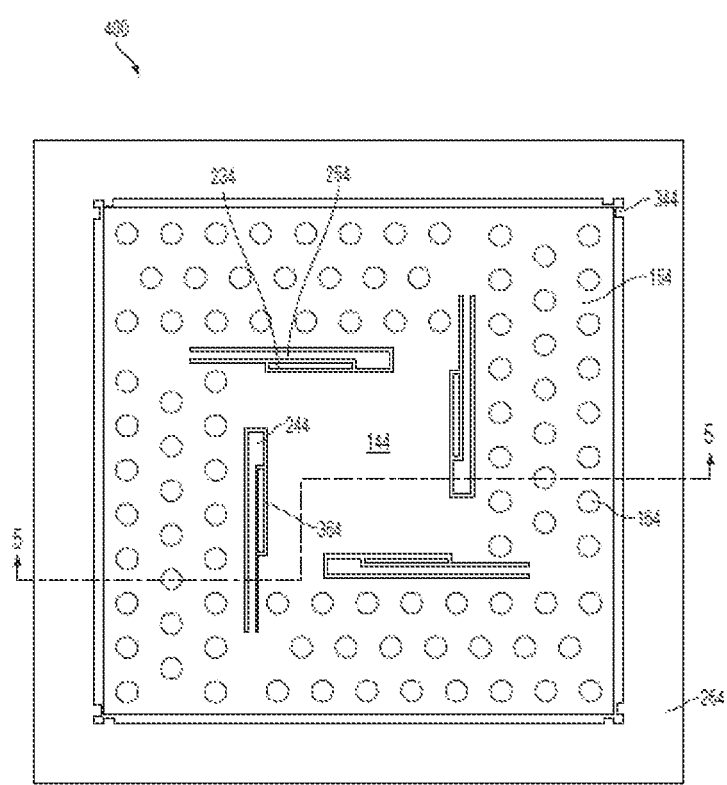
FIG. 4 shows an embodiment of the top view of a device layer of a piston microphone.

FIG. 4 shows a top view of device layer 400 of a piston microphone with rigid first plate 144 that senses acoustic pressure on its first surface, a rigid second plate 154 with perforations 164, and linkages 254 attached to an anchor 244. The number of linkages 254 shown in the device is four, but the number of linkages could be any number and that would be within the spirit and scope of the present invention. Undesired in plane movements can be limited by introducing in plane bump stops 344 at locations where undesired movement/rotation has a high amplitude, e.g., furthest away from the linkages 254. The in plane bump stops 344 can be defined on the second plate 154 or the device layer 104 or the first plate 144, or any combination thereof.

Figure 5:
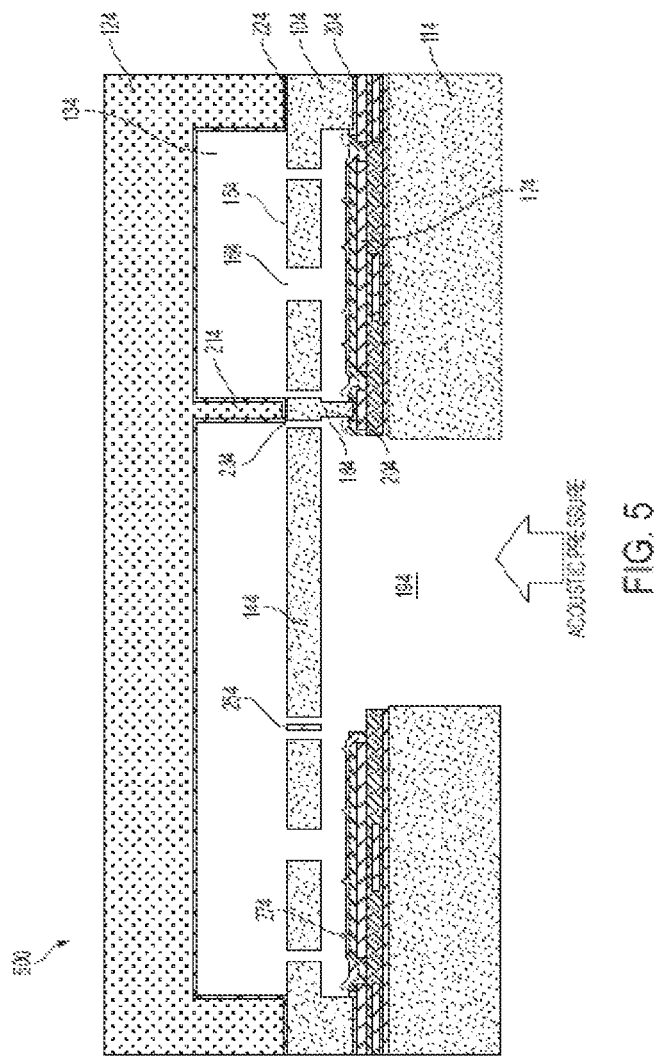
FIG. 5 shows the cross section of the piston microphone with integrated back cavity along 5-5 in FIG. 4.

FIG. 5 shows the cross section of the piston microphone 500, with integrated back cavity 134 along 5-5 in FIG. 4. In an embodiment, the device layer 104 is device layer 400 in FIG. 4. The integrated back cavity 134 is formed by a fusion (oxide) bond 224 between a second substrate 124 and the device layer 104 which further is bonded to the first substrate 114 by a conductive alloy (eutectic) bond 204 by processes as described in a commonly owned U.S. Pat. No. 7,442,570, entitled, "Method of Fabrication of a Al/Ge Bonding in a Wafer Packing Environment and a Product Produced Therefrom", which is incorporated herein by reference. Static pressure in the back cavity 134 is equalized by ambient pressure via air flow through the PEC 234. Linkages 254 are attached to the standoffs 184 both mechanically and electrically.

Acoustic barriers 364 may be introduced wherever suitable for required low frequency response enhancement.

The first plate 144 is partially surrounded by a PEC 234. The entire structure is surrounded by a seal 264 to ensure that the only acoustical input to a cavity 134 is via acoustic port 194. When an acoustic force is applied on the first surface of first plate 144, the first plate 144 is displaced up or down depending on polarity of pressure. The second plate 154 is displaced in the same direction as the first plate 144. Both plates 144 and 154 are attached to the anchors 244 via the linkages 254, which apply an opposite restoring force to first and second plates 144 and 154. When the acoustic force is reduced to zero, the restoring force brings first and second plates 144 and 154 to their original operating position.

The standoffs 184 are lithographically defined protruding members of the device layer that are mechanically and electrically connected to the first substrate 114 via alloy (eutectic) bonding to a top metal layer of the first substrate 114. The device layer 104 is lithographically patterned to form the first plate 144, second plate 154 and plate with perforations 164, the PEC 234 and an acoustic seal around the active device. The second plate 154 forms a first electrode and is electrically connected to an integrated circuit (IC) manufactured on the first substrate 114, while a second electrode 174 manufactured on the first substrate 114 is designed to be aligned with first electrode 174. A first (bottom) surface of the second plate 154 and the second electrode 174 forms a variable capacitor whose value depends on the pressure applied on the first surface of the first plate 144. The second electrode 174 in an embodiment is buried under a stack of silicon nitride and silicon dioxide which further can be lithographically patterned to form bump stops 274 to reduce stiction force by reducing contact area in the undesired event that first and/or second plates 144 and 154 come into contact with the first substrate 114.

Figure 6A:
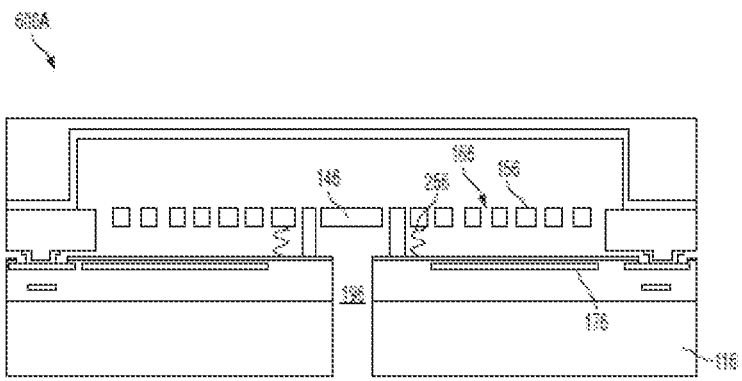
FIGS. 6A and 6B show the operation of a piston microphone using a symbolic representation for the linkage with bending compliance.
Figure 6B:
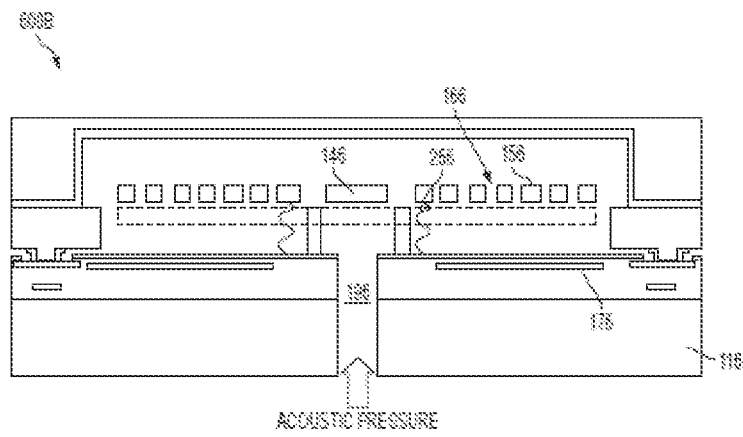

FIGS. 6A and 6B illustrate the conceptual designs showing the operation of a piston microphone of FIG. 5. The linkages 254 in FIG. 5 are now represented by symbolic springs 256 and support the first plate 146, second plate 156 the acoustic port 196 is a channel in a first substrate 116 for acoustic pressure to reach the first surface of the first plate 146. Under an applied acoustic pressure the first plate 146 slightly moves up or down depending on polarity of sound pressure. In FIG. 6B, the case where the first plate 146 moves up is depicted. This upward movement of first plate 146 is coupled to a second plate 156 with perforations 166, which in turn results in increased gap between the first surface of the second plate 156 and the second electrode 176; hence the capacitance defined by these two surfaces decreases. An IC manufactured on the first substrate 116 is electrically connected to both of the electrodes 156 and 176; hence it is used to detect the change in capacitance, which is proportional to the acoustic pressure.

Figure 7:
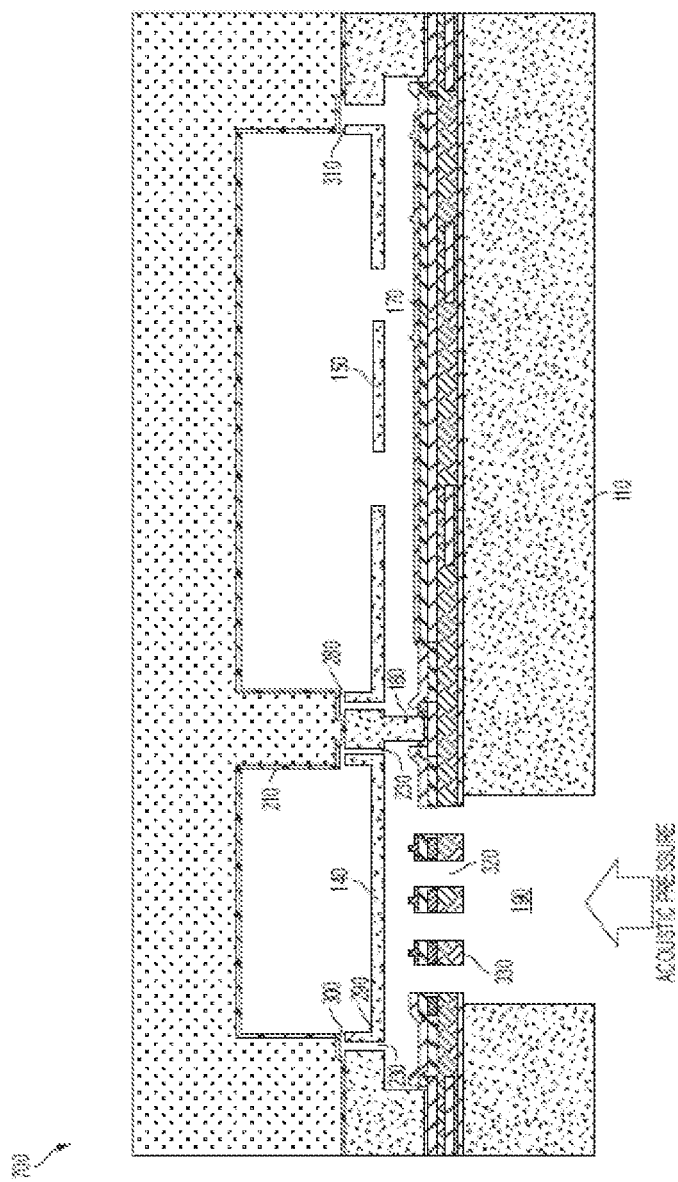
FIG. 7 shows alternative manufacturing options for a torsional microphone.

FIG. 7 shows alternative manufacturing options for a torsional microphone 700. In one alternative scheme, the posts 210 can be made wider to overlap over a PEC 230, while forming a shallow recess step to form a well-controlled and shallow extended PEC 280 for improving the low frequency response of the microphone. The depth of the channel is controllable as well as the length to provide a means to properly design a pressure equalization channel for proper frequency response. Similarly defining a partial overlap of the second substrate 120 over the outer periphery of the second plate 150 creates a bump stop 310 which limits out of plane, upward movement of the first and second plates 140 and 150. By proper design of the bump stop 310 the potential risk of the first plate 140 touching the first substrate 110 can be reduced significantly. Similarly, proper design of the length of an extended PEC 300 over outer edge (furthest away from the rotation axis) of the first plate will limit the rotational movement of the first and second plates 140 and 150 and may be used for significantly reducing the potential risk of first or second plates 140, 150 touching the first substrate 110. Limiting out of plane movement improves device reliability, especially against stiction, vibrations and shocks.

In another embodiment, the first and second plates 140 and 150 can be thinned down selectively so as to have a thicker portion and a thinner portion, creating a stepped device layer 290, for increasing resonant frequency of the device and reducing acoustic resistance of the perforations 160. In an embodiment, linkage 250 can have the same thickness as the thicker portion of first plate 140 or second plate 150. In another embodiment, linkage 250 can be same thickness as the thinner portion of first plate 140 or second plate 150. In another embodiment, linkage 250 can be of any thickness independent of the first and second plates. By proper design of the step profile of the first and second plates 140 and 150, first and second plates can be manufactured to be stiff enough to perform as microphone plates.

In another embodiment, back plate 330 with perforations 320 is provided to serve as a rigid electrode on the first substrate covering acoustic port 190, which faces the first surface side of the first plate 140. In an embodiment, the rigid back plate 330 can partially or completely cover the acoustic port 190. By proper design of a plate 330 with perforations 320, acoustic pressure input through acoustic port 190 will reach the first surface of the first plate 140 without noticeable attenuation, while the parallel plate capacitance formed by the back plate 330 and the first plate 140 will increase the electronic sense capacitance.

Under the influence of acoustic input, the capacitance between the back plate 330 and first plate 140 will change in the opposite phase to the capacitance formed between the second plate 150 and the second electrode 170. The phase difference between sense capacitances enables differential sensing. An additional benefit of the differential structure is the possibility of recovering from a stiction. In the event that either the first plate 140 or the second plate 150 comes into contact with the first substrate 110 and gets stuck, an electrical bias can be applied between the plate that is not in contact with the first substrate 110 and corresponding electrode (second electrode 170 or the back plate 330) for recovering from stiction. It is also possible to sense the tilting of plates and dynamically adjust bias applied across the plates to ensure that they do not come into contact with the first substrate 110.

FIG. 8 shows alternative manufacturing embodiment for the piston microphone. In one embodiment, the posts 214 can be made wider to overlap over a PEC 234, while forming a shallow recess step to form a well-controlled and shallow extended PEC 284, in order to improve low frequency response of the microphone. In a similar way, a partial overlap of bump stop 314 of the second substrate 124 over the outer periphery of the second plate 154 limits out of plane (upward) movement of the first and second plates 144, 154. Limiting of out of plane movement improves device reliability, especially to vibrations and shocks.

In another alternative scheme, the first and second plates 144, 154 can be thinned down selectively, creating a stepped device layer 294 to increase resonant frequency of the structure and to reduce acoustic resistance of perforations.

In another embodiment, back plate 334 with perforations 324 is provided to serve as an electrode on the first substrate covering acoustic port 194, which faces the first surface side of the first plate 144. In an embodiment, the rigid back plate 334 can partially or completely cover the acoustic port. By proper design of a plate 334 with perforations 324, acoustic input (sound pressure) through the opening (acoustic port 194) will reach the first surface of the first plate 144 without noticeable attenuation, while the parallel plate capacitance formed by this back plate 334 and the first plate 144 will increase the electronic sense capacitance.

Under the influence of acoustic input, this capacitance will change in the same phase as the capacitance formed between the second plate 154 and the second electrode 174. Hence the total sense capacitance will increase.

Figure 9A:
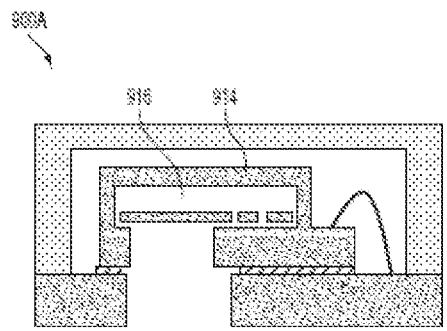
FIGS. 9A, 9B and 9C show various packaging schemes.
Figure 9B:
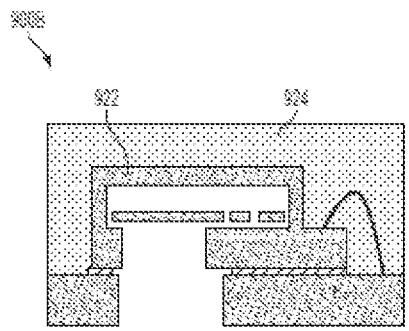
Figure 9C:
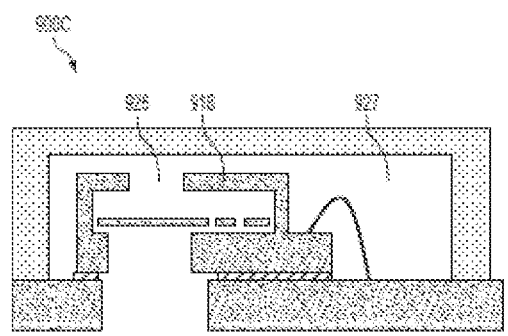

FIGS. 9A, 9B, and 9C show various packaging schemes that can be applied to any of the described embodiments of a microphone. FIG. 9A illustrates a capped package 900A with integrated device 914. Back cavity 916 is self-contained in the integrated device 914. FIG. 9B shows a molded package 900B where a plastic or similar encapsulating material 924 is molded or formed over the integrated device 922. FIG. 9C illustrates a capped package 900C that forms an extended back cavity 927 via an acoustic port 926 opened on top surface of integrated device 918.

FIG. 10 shows an embodiment which integrates a MEMS microphone 370 with one or more other MEMS devices 380 on the first and second substrates. Other MEMS devices include but are not limited to the gyroscope, accelerometer, pressure sensor and compass. MEMS microphone 370 can be a piston microphone or a torsional microphone as described in FIGS. 1, 2, 4, 5, 7, and 8.

Both torsional and piston designs of microphone provide improvements over conventional designs. The integrated back cavity where the enclosure is defined by the first and second substrates and integrated electronics from the CMOS-MEMS construction enables a significantly smaller package footprint than in conventional two-chip solutions. The integrated back cavity also relieves packaging considerations where the MEMS die and package together form the back cavity.

The torsional design inherently is expected to be less sensitive to accelerations during operation compared to similar dimensioned or larger microphones. Piston design, in terms of electronic pickup and movement of plates, is similar to existing MEMS and condenser microphones, but unlike the others is based on movement of solid plates, not diaphragms. Also, unlike other designs, pressure sensing area and electrode area can be adjusted separately, giving extra flexibility on design at a cost of area/mass.

With reference to FIGS. 11, 12, 13, 14, in various embodiments described herein, combination sensor and MEMS microphone devices 1100, 1200, 1300, 1400 are illustrated and/or described. The combination sensor and MEMS microphone devices 1100, 1200, 1300, 1400 can include sensors of various different types including sensors for pressure, motion and sound sensing. In some embodiments, the combination sensor and MEMS microphone devices 1100, 1200, 1300, 1400 can include various sensing functionality from 8-axis sensing functionality to 11-axis sensing functionality on a single chip. An 8-axis sensing device includes a 3-axis gyroscope, a 3-axis accelerometer, a pressure sensor and a microphone. An 11-axis sensing device includes a 3-axis gyroscope, a 3-axis accelerometer, a 3-axis magnetometer, a pressure sensor and a microphone. For example, in some embodiments, sensing of different types can be combined for integrated audio and/or motion processing and capability in a single package.

One or more embodiments can provide a smaller footprint than conventional, separate devices performing audio and motion processing functions. The footprint can be smaller because a single package, instead of multiple packages, can be employed to perform both audio and motion processing. Further, the cost of the combination sensor and MEMS microphone device can be lower than conventional approaches due to package sharing and ASIC sharing.

One or more embodiments can also integrate electronics and/or reduce the number of ports to the environment outside of the combination sensor and MEMS microphone devices 1100, 1200, 1300, 1400. The system package embodied as combination sensor and MEMS microphone devices 1100, 1200, 1300, 1400 can be fabricated in a low-cost manner because the design calls for only a single port to the environment. Additionally, performance can be improved because the lid employed in the embodiments can remove potential package stress-related issues common in plastic molded packages that impact offset stability; and the design provides flexibility for future audio systems.

In one embodiment, one or more of the combination sensor and MEMS microphone devices 1100, 1200, 1300, 1400 can include a combination inertial measurement unit (IMU), pressure sensor and MEMS microphone. For example, the IMU can include, but is not limited to, an accelerometer, a gyroscope and/or a magnetometer.

Figure 11:
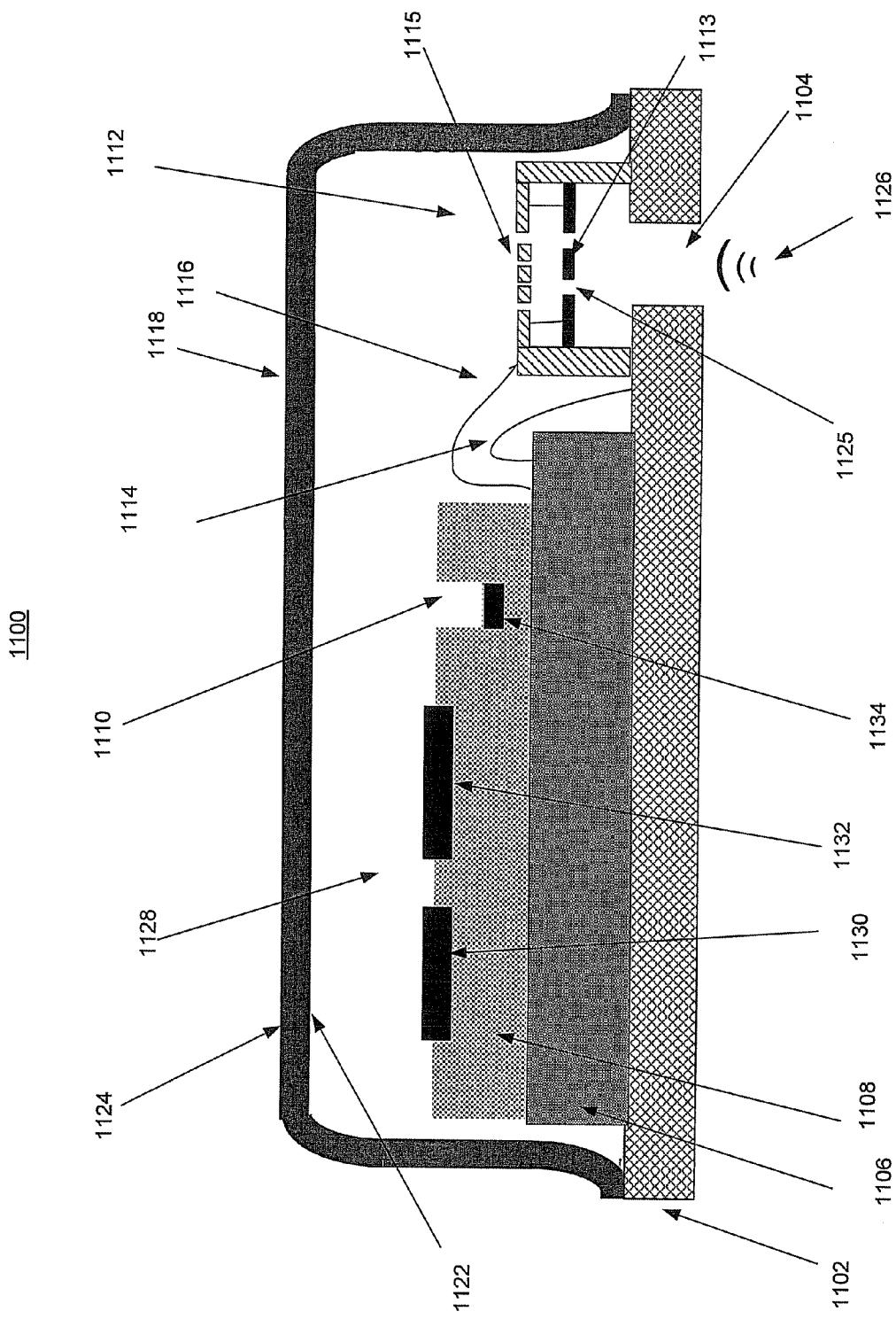
FIG. 11 shows an example side view of a combination inertialensor, pressure sensor and MEMS microphone device in accordance with one or more embodiments described herein.

Turning now to FIG. 11, shown is an example side view of a combination sensor, pressure sensor and MEMS microphone device combination sensor in accordance with one or more embodiments described herein. The combination sensor and MEMS microphone device 1100 can include various different types of sensors 1130, 1132, 1134 and MEMS microphone device 1112, which includes a diaphragm 1113 with pressure equalization channels 1125 and perforated back plate 1115. Displacement of diaphragm 1113 due to sound pressure is sensed capacitively by back plate 1115, which serves as an electrode.

By way of example, but not limitation, eight axes of sensing can be provided via MEMS measurement device 1108. In some embodiments, MEMS measurement device 1108 can include, but is not limited to, a gyroscope 1130 (e.g., a three axis gyroscope) that can sense angular velocity, an accelerometer 1132 (e.g., a three axis accelerometer) that can sense acceleration, and a pressure sensor 1134 that can sense atmospheric pressure. In some embodiments, pressure sensor 1134 can be a pressure sensor membrane that can sense pressure in the back cavity 1128 of the combination sensor and MEMS microphone device 1100. Although not shown, in some embodiments, MEMS measurement device 1108 can also include a magnetometer.

Pressure measurement can be facilitated via pressure sensor 1134 of MEMS measurement device 1108 while a sound measurement can be facilitated via MEMS microphone device 1112. Some embodiments show, one or more holes or channels are provided in the diaphragm 1113 of the MEMS microphone device 1112 to allow pressure from the acoustic waves 1126 received at the port 1104 to flow through the diaphragm 1113 and to the back cavity 1128 at which the pressure sensor 1134 can then sense the atmospheric pressure associated with the acoustic waves 1126 and/or the pressure outside of the combination sensor and MEMS microphone device 1100 generally. In that regard, the pressure sensor 1134 can perform one or more functions similar to a barometer.

Accordingly, the embodiment shown can provide a MEMS microphone, a motion sensor and a pressure sensor in the same package using a single port since both devices (e.g., MEMS microphone device 1112 and the pressure sensor 1134) can utilize a single port to the environment external to the combination sensor and MEMS microphone device 1100. Typically, a pressure sensor (e.g., pressure sensor 1134) would not be provided in the same device as a device with a gyroscope (e.g., gyroscope 1130) and an accelerometer (e.g., accelerometer 1132) since the gyroscope and the accelerometer sensors do not require air exposure (and these types of sensors are not typically exposed to air), and the pressure sensor (e.g., pressure sensor 1134) includes a pressure membrane that is exposed to the environment. The pressure sensor is shown downstream from the microphone. The atmospheric pressure must be transmitted through the microphone. This is possible because the cutoff frequency of the microphone is typically around 50 hertz (Hz), meaning that sound signals with frequencies less than 50 Hz are not sensed by the microphone as they are passed or leaked through the microphone element. Even microphones with very low cutoff frequencies such as 20 Hz would transmit the slowly varying atmospheric pressure. This atmospheric pressure that is typically measured for motion sensing serves as a barometer to provide elevation information. In the event of a rapidly ascending or descending motion like in an elevator, the cutoff frequency of the microphone is sufficiently high enough to permit the pressure signal to pass through with sufficient resolution to indicate building floors. For example a high speed elevator may move as fast as 15 meters per second. For one meter resolution which is more than sufficient for floor level indication the requirement for sampling is 15 Hz which is below the low cutoff frequency of the microphone which indicates the transmission of the atmospheric pressure signal through the microphone.

The embodiment shown in FIG. 11 can be designed in such manner since the MEMS microphone device 1112 and the pressure sensor 1134 utilize sound waves or pressure and both employ a port for functionality. These devices can then share the attributes of the package allowing air to enter through the port while one sensor measures sound via the air (e.g., the MEMS microphone device 1112) and the other sensor measures acoustic pressure via the air (e.g., the pressure sensor 1134). Accordingly, one port can be utilized for two sensors thereby allowing cost of the port to be shared by the two devices.

Port 1104 is provided in package substrate 1102 facilitate entry of the air (which includes the acoustic waves 1126) to MEMS microphone device 1112 and for entry of the air for atmospheric pressure sensing by pressure sensor 1134. Port 1110 in the MEMS measurement device 1108 can provide air access to the pressure sensor 1134 that can sense (via a pressure sensor membrane (not shown)) the pressure in the back cavity 1128.

The combination sensor and MEMS microphone device 1100 can also include a processor 1106. The processor 1106 can be configured to provide specialized processing in association with motion, sound and/or pressure sensing. For example, in some embodiments, processor 1106 can include structure and/or functionality for specialized digital signal processing of audio and/or motion data associated with the information sensed by the MEMS microphone 1112, gyroscope 1130, accelerometer 1132, pressure sensor 1134 and/ or the magnetometer (not shown). In some embodiments, processor 1106 can include structure and/or functionality configured to perform processing of information, commands, etc. and an application specific integrated circuit (ASIC) for processing information/signals associated with the MEMS microphone device 1112. In some embodiments, the ASIC includes or is a complementary metal oxide semiconductor (CMOS) configured to provide processing functionality related to the MEMS microphone device 1112. In the embodiment shown, the processor 1106 can include a 7-axis CMOS and the CMOS that supports the MEMS microphone device 1112 on the same substrate to obtain a reduced overall size of the combination sensor and MEMS microphone device 1100 via the combination of the two ASICs on the same substrate.

Typical packaging can be Land Grid Array (LGA) laminate with a lid. As shown, in FIG. 11, the port 1104 is a bottom port, and the components can be covered in lid 1118. The area under the lid 1118 forms back cavity 1128. In some embodiments, the lid 1118 is metal; however, in other embodiments, the lid 1118 can be composed of other forms such as ceramics, silicon and plastics including an additional laminate.

In various embodiments, one or more of the MEMS microphone device 1112, and the package substrate 1102 can be electrically coupled to processor 1106 to perform one or more functions of combination sensor and MEMS microphone device 1112. By way of example, but not limitation, in some embodiments, MEMS microphone device 1112 can be electrically coupled to the processor 1106 via wire bond 1116 while the package substrate 1102 can be electrically coupled to the processor 1106 via wire bond 1114. Alternatively the MEMS microphone device can be electrically coupled to the package substrate 1102 where it can then be electrically coupled to the processor 1106 through the package substrate 1102. In another embodiment, not shown, other electrical packaging techniques such as flip chip or substrate bump bonding can be employed to electrically couple one or both of the processor and MEMS microphone device to the package substrate. Combinations of wire bonding and bump bonding can be used to make electrical couplings between the package substrate, MEMS microphone device, and processor.

In some embodiments, the MEMS microphone device 1112 includes a diaphragm 1113, which forms a capacitor with back plate 1115. The capacitance of the microphone device 1112 can be modulated by the amount of deflection of the diaphragm 1113 resultant from the acoustic waves 1126 incident on the diaphragm 1113. In some embodiments, upon deflection of the diaphragm, a corresponding electrical signal can be generated and transmitted from MEMS microphone device 1112 to the processor 1106 via wire bond 1116.

The diaphragm can be a micro-machined structure that deflects or otherwise locates to a new position in response to an acoustic wave 1126 entering at the port 1104. The acoustic wave 1126 enters the port 1104 formed through the package substrate 1102. The port 1104 can be any size suitable for receiving and/or detecting the acoustic waves 1126 intended to enter the combination sensor and MEMS microphone device 1100. Specifically, the port 1104 can provide a recess/opening to an external environment outside of the combination sensor and MEMS microphone device 1100 such that sound generated external to the combination sensor and MEMS microphone device 1100 is received by the port 1104. Accordingly, the port 1104 can be positioned at any number of different locations within package substrate 1102 in suitable proximity to the MEMS microphone device 1112 that allows the diaphragm 1113 of the MEMS microphone device 1112 to detect the acoustic waves 1126 external to the combination sensor and MEMS microphone device 1100.

In the embodiment shown in FIG. 11, the processor 1106, and the MEMS measurement device 1108 are formed from two different substrates that are then stacked and/or bonded together. In some embodiments, the processor 1106 and/or the MEMS measurement device 1108 and/or the MEMS microphone device 1112 can be on any number of different surfaces inside or outside of the combination sensor and MEMS microphone device 1100 and one or more (or, in some embodiments, no) components need be stacked on one another. All such embodiments are envisaged.

While the components are shown in the particular arrangement illustrated in FIG. 11, in other embodiments, any number of different arrangements of the components is possible and envisaged.

Figure 12:
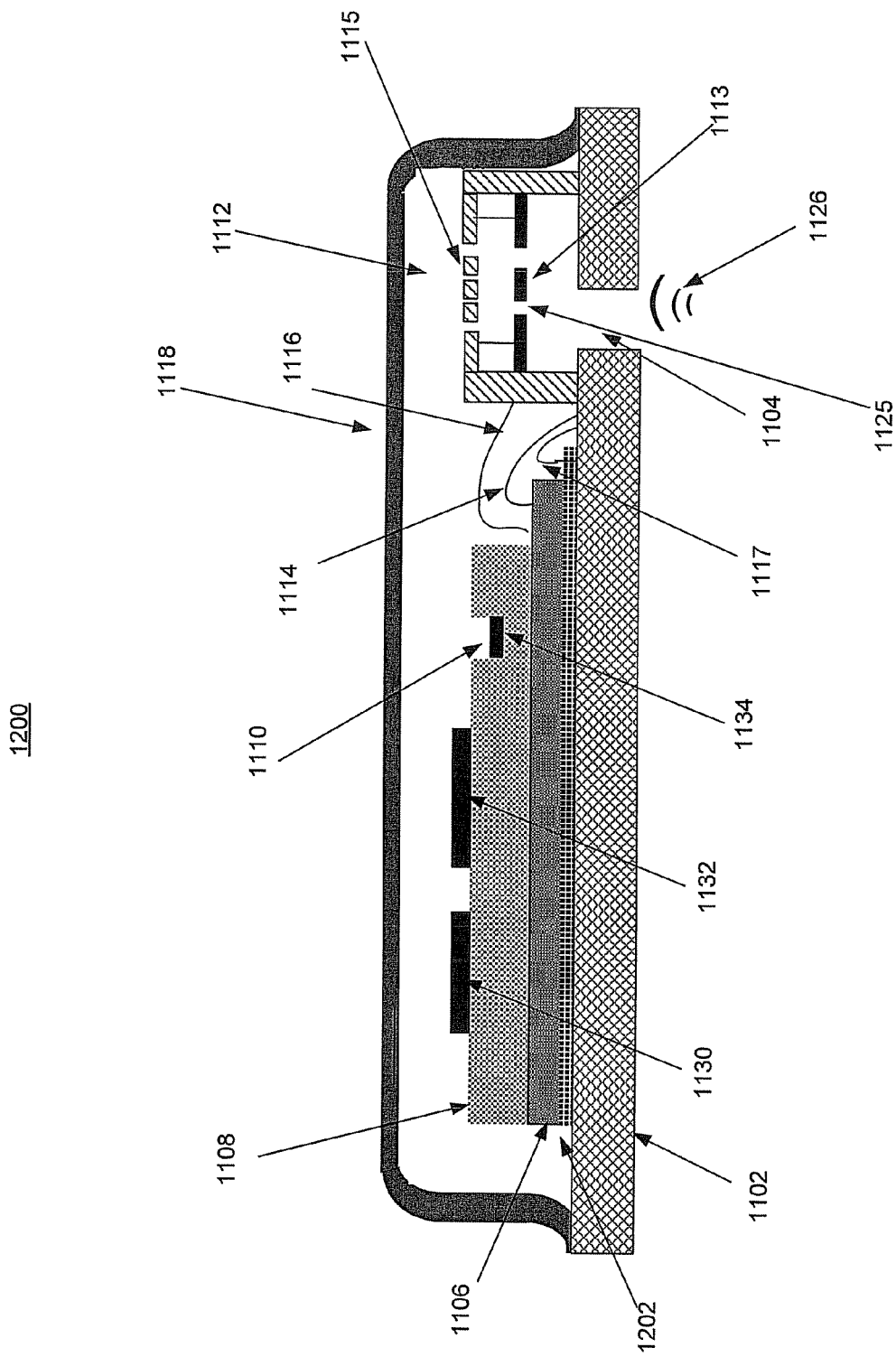
FIG. 12 shows an example of a side view of another combination inertial sensor, pressure sensor, and MEMS microphone device in accordance with one or more embodiments described herein.

FIG. 12 shows an example of a side view of another combination sensor, pressure sensor, and MEMS microphone device combination sensor in accordance with one or more embodiments described herein. Repetitive description of like elements employed in respective embodiments of systems and/or apparatus described herein are omitted for sake of brevity.

Similar to combination sensor and MEMS microphone device 1100, combination sensor and MEMS microphone device 1200 can include the MEMS measurement device 1108, the processor 1106 and the MEMS microphone device 1112. However, combination sensor and MEMS microphone device 1200 can also include an additional processor 1202. The processor 1202 can be electrically coupled to the package substrate 1102 via the wire bond 1117. A second processor typically will provide greater data processing, logic operations, and communication functions. The processor may take information outside of device 1200 such as commands or other data from a larger system not shown. Electrical coupling techniques such as wire bonding and substrate bumping can be employed to produce the necessary electrical connections between the additional processor 1202, the MEMS measurement device 1108, the processor 1106 and the MEMS microphone device 1112.

As shown, processor 1202 can be stacked on the package substrate 1102 with the MEMS measurement device 1108 and the processor 1106. Any order of stacking of the processor 1202, MEMS measurement device 1108 and the processor 1106 can be employed. Further, in some embodiments, the processor 1202, the processor 1106 and/or the MEMS measurement device 1108 can be on any number of different surfaces inside or outside of the combination sensor and MEMS microphone device 1200 and one or more (or, in some embodiments, no) components need be stacked on one another. All such embodiments are envisaged.

In the embodiment shown, the combination sensor and MEMS microphone device 1200 can be part of a sensor hub as combination sensor and MEMS microphone device 1200 may have the capability to receive inputs from other sensors. The information or data from the outside sensors can then be combined with the combination sensor and MEMS microphone device 1200 data and then communicated to a host processor outside of combination sensor and MEMS microphone device 1200. The sensor hub becomes a central data collection and sensor data processing location which can provide system simplicity and power savings to the host system. The host system can include an application processor and an audio codec, which are typically found in a mobile handset system. The sensor hub can interface with one or both the audio codec or application processor. In addition to information that MEMS microphone device 1112 and sensors 1134, 1132, 1130 can receive and/or process, the sensor hub can receive and process other information from sensors that are within the combination sensor and MEMS microphone device 1200 or external to the combination sensor and MEMS microphone device 1200. The sensed information can include, but is not limited to, ambient light, ultrasonic wave, infrared light, temperature, humidity, and gas species.

In the embodiment shown, the microphone can be an alternative to the accelerometer as the microphone is typically on the sensor within a larger system. Similar to the low power consuming accelerometer that senses motion and then generates a signal to wake-up or turn on a larger system, a low power microphone can provide a similar trigger in the event of a sound detection. The sound is sensed by the microphone and the logic to trigger a wake-up signal can be achieved by the processing capability within the combination sensor and MEMS microphone device 1200. This can provide significant power savings with power management of a larger system like the audio codec or application processor.

Figure 13:
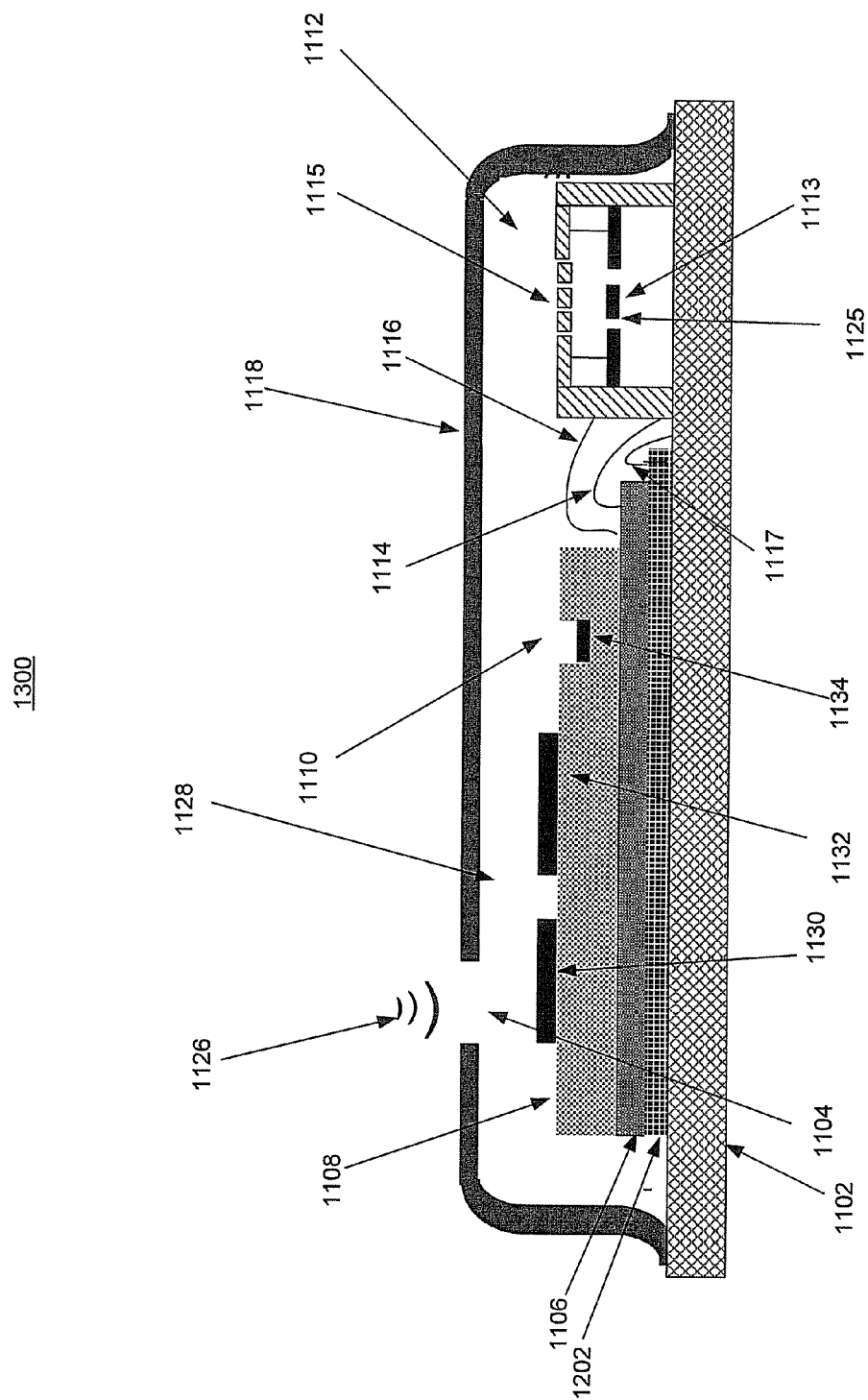
FIG. 13 shows an example side view of a combination inertial sensor, pressure sensor, and MEMS microphone device in accordance with one or more embodiments described herein.

FIG. 13 shows an example side view of a combination sensor, pressure sensor, and MEMS microphone device combination sensor in accordance with one or more embodiments described herein. Repetitive description of like elements employed in respective embodiments of systems and/or apparatus described herein are omitted for sake of brevity.

As shown, processor 1202 can be stacked on the package substrate 1102 with the MEMS measurement device 1108 and the processor 1106. Any order of stacking of the processor 1202, MEMS measurement device 1108 and the processor 1106 can be employed. Further, in some embodiments, the processor 1202, the processor 1106 and/or the MEMS measurement device 1108 can be on any number of different surfaces inside or outside of the combination sensor and MEMS microphone device 1300 and one or more (or, in some embodiments, no) components need be stacked on one another. All such embodiments are envisaged.

As in FIGS. 11 and 12, in some embodiments, the MEMS microphone device 1112 includes a diaphragm 1113, which forms a capacitor with back plate 1115. The capacitance of the microphone device 1112 can be modulated by the amount of deflection of the diaphragm 1113 resultant from the acoustic waves 1126 incident on the diaphragm 1113. In some embodiments, upon deflection of the diaphragm, a corresponding electrical signal can be generated and transmitted from MEMS microphone device 1112 to the processor 1106 via wire bond 1116.

In the embodiment shown in FIG. 13, the port 1104 is positioned within the lid 1118 in lieu of being positioned in the package substrate 1102. The port 1104 is in suitable proximity to the MEMS microphone device 1112 such that the diaphragm 1113 of the MEMS microphone device 1112 can detect the acoustic waves 1126 external to the combination sensor and MEMS microphone device 1300 and in suitable proximity to the pressure sensor 1134 to allow detection of external pressure.

Figure 14:
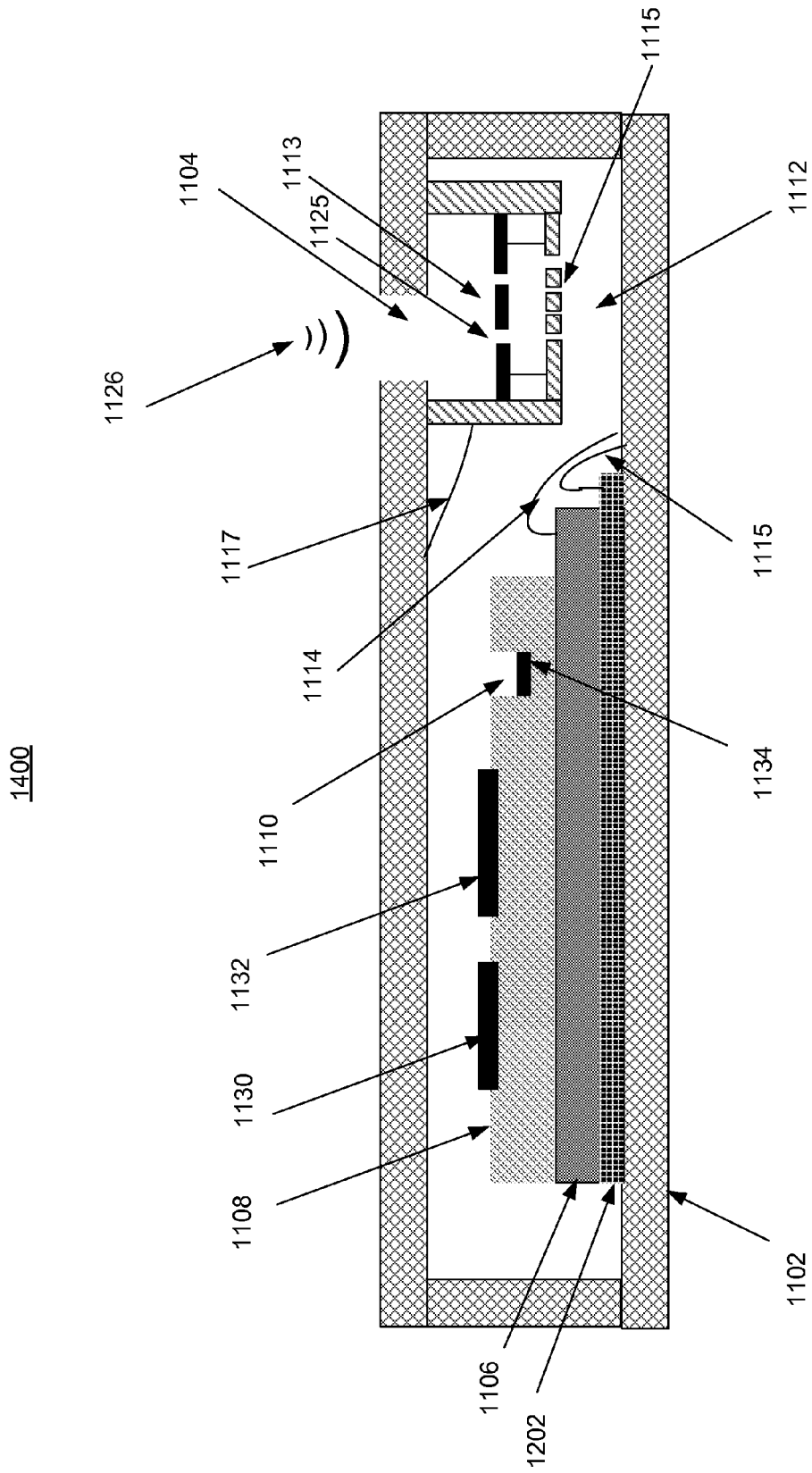
FIG. 14 shows an example of a side view of another combination inertial sensor, pressure sensor, and MEMS microphone device in accordance with one or more embodiments described herein.

FIG. 14 shows an example of a side view of another combination sensor, pressure sensor, and MEMS microphone device combination sensor in accordance with one or more embodiments described herein. Repetitive description of like elements employed in respective embodiments of systems and/or apparatus described herein are omitted for sake of brevity. As shown, in this embodiment, in lieu of the lid 1118, combination sensor and MEMS microphone device 1400 includes the package substrate 1102 as an enclosure for the MEMS microphone device 1112, MEMS measurement device 1108 (and gyroscope 1130, accelerometer 1132 and/or pressure sensor 1134 of the MEMS measurement device 1108). As shown, the port 1104 can be provided in the package substrate 1102 in proximity to the MEMS microphone device 1112 and the pressure sensor 1134 of the MEMS measurement device 1108.

As also shown, processor 1202 can be stacked on the package substrate 1102 with the MEMS measurement device 1108 and the processor 1106. Any order of stacking of the processor 1202, MEMS measurement device 1108 and the processor 1106 can be employed. Further, in some embodiments, the processor 1202, the processor 1106 and/or the MEMS measurement device 1108 can be on any number of different surfaces inside or outside of the combination sensor and MEMS microphone device 1400 and one or more (or, in some embodiments, no) components need be stacked on one another. All such embodiments are envisaged.

Although not shown, in some embodiments, MEMS measurement device 1108 can also include a 3-axis magnetometer to provide a combination sensor and MEMS microphone device 1100, 1200, 1300, 1400 with 11 axes of sensing. In the various embodiments, numerous components can be provided via a single chip, which can utilize sensor integration of sensors 1130, 1132, 1134, MEMS microphone device 1112 and any other sensors in the combination sensor and MEMS microphone devices 1100, 1200, 1300, 1400.

Figure 15:
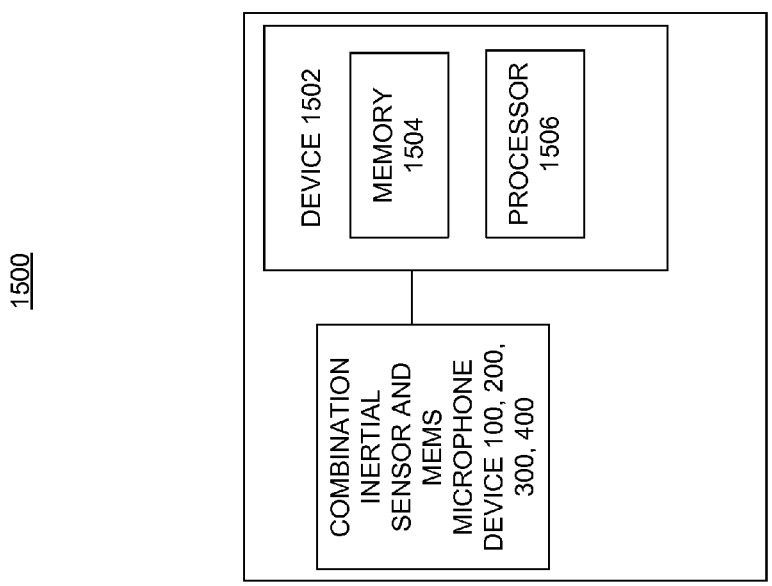
FIG. 15 shows an exemplary system employing a combination inertial sensor, pressure sensor, and MEMS microphone device such as that described and/or illustrated with reference to FIGS. 11, 12, 13 and/or 14 in accordance with one or more embodiments described herein.

FIG. 15 illustrates an exemplary system employing a combination sensor, pressure sensor, and MEMS microphone device combination sensor such as that described and/or illustrated with reference to FIGS. 11, 12, 13 and/or 14 in accordance with one or more embodiments described herein. Repetitive description of like elements employed in respective embodiments of systems and/or apparatus described herein are omitted for sake of brevity.

The system 1500 can include a device 1502, one or more of combination sensor and MEMS microphone devices 1100, 1200, 1300, 1400, memory 1504 and/or processor 1506. In various embodiments, one or more of device 1502, combination sensor and MEMS microphone devices 1100, 1200, 1300, 1400, memory 1504 and/or processor 1506 can be electrically and/or communicatively coupled to one another to perform one or more functions of system 1500. As described with reference to FIGS. 11, 12, 13 and/or 14, combination sensor and MEMS microphone devices 1100, 1200, 1300, 1400 can be disposed to perform sound, pressure and/or motion sensing and information processing. In some embodiments, combination sensor and MEMS microphone devices 1100, 1200, 1300, 1400 can output a signal based on information processed at one or more of the processors 1106, 1202 or after detection of sound, pressure and/or motion by gyroscope 1130, accelerometer 1132, pressure sensor 1134 and/or MEMS microphone device 1112. Device 1504 can be configured to process, transmit and/or receive one or more signals for, to and/or from combination sensor and MEMS microphone devices 1100, 1200, 1300, 1400 to perform or facilitate performance of one or more functions of system 1500.

Memory 1504 can store computer-executable instructions that can be executed by processor 1506. For example, memory 1504 can store instructions for performing any number of functions utilizing information generated by combination sensor and MEMS microphone devices 1100, 1200, 1300, 1400 or the like. Processor 1506 can process computer-readable storage medium computer-executable instructions to perform one or more of the functions described herein with reference to combination sensor and MEMS microphone devices 1100, 1200, 1300, 1400 or device 1502, including, but not limited to, generating a signal indicative of detected acoustic waves, processing the generated signal to perform one or more functions of speech processing functions, generating a signal indicative of a detected pressure, acceleration, orientation, motion or the like.

In some embodiments, system 1500 is or is included in an automobile, mobile device (e.g., mobile telephone, laptop, tablet, personal digital assistant), wearable article of clothing or the like.

Figure 16:
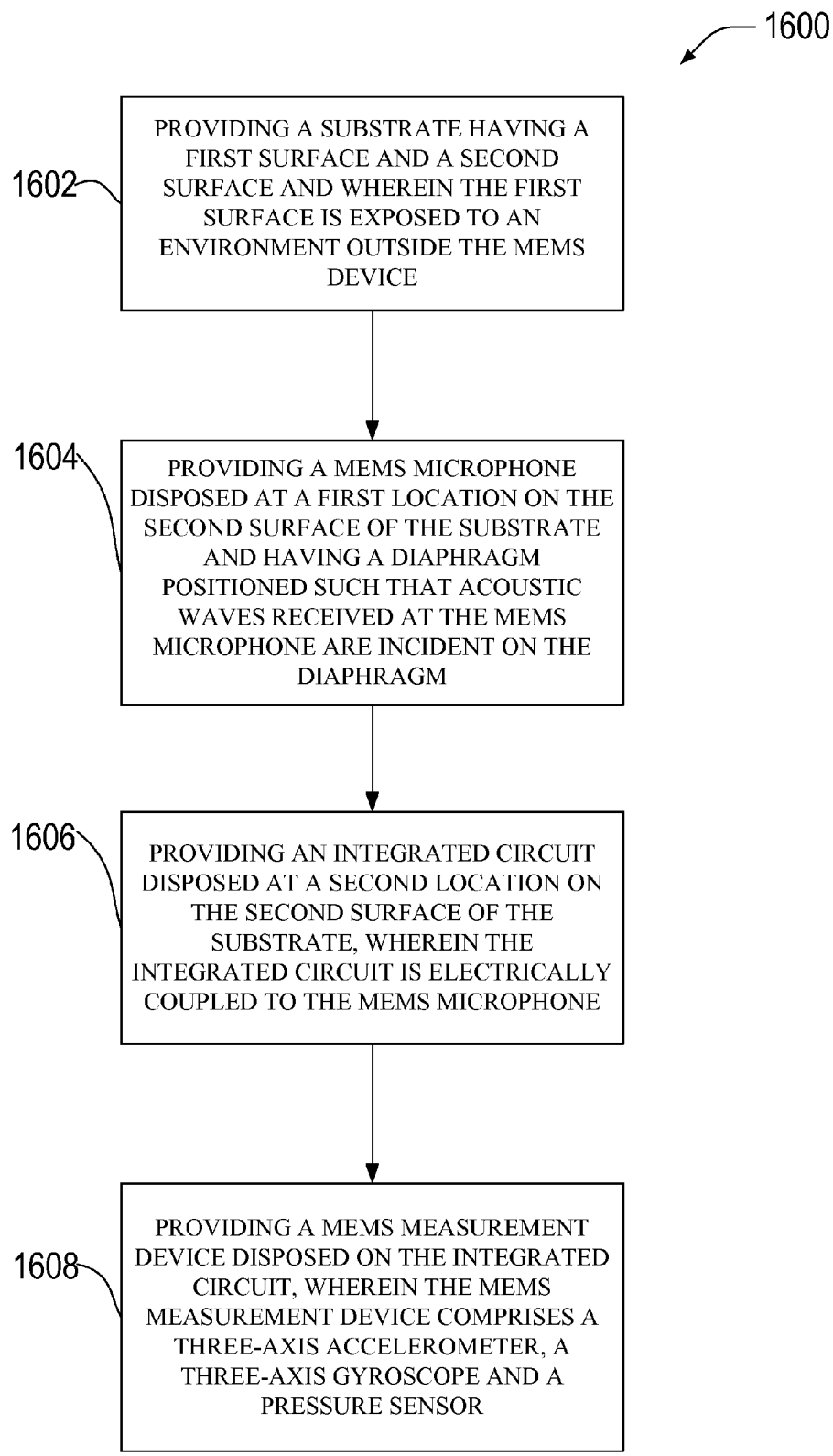
FIG. 16 shows an exemplary method of fabrication of a combination inertial sensor, pressure sensor, and MEMS microphone device in accordance with one or more embodiments described herein with reference to FIGS. 11, 12, 13 and/or 14.

FIG. 16 illustrates an exemplary method of fabrication of a combination sensor, pressure sensor, and MEMS microphone device combination sensor in accordance with one or more embodiments described herein with reference to FIGS. 11, 12, 13 and/or 14. As shown in FIG. 16, at 1602, method 1600 can include providing a substrate having a first surface and a second surface and wherein the first surface is exposed to an environment outside the MEMS device. At 1604, method 1600 can include providing a MEMS microphone disposed at a first location on the second surface of the substrate and having a diaphragm positioned such that acoustic waves received at the MEMS microphone are incident on the diaphragm. At 1606, method 1600 can include providing an integrated circuit disposed at a second location on the second surface of the substrate, wherein the integrated circuit is electrically coupled to the MEMS microphone.

At 1608, method 1600 can include providing a MEMS measurement device disposed on the integrated circuit, wherein the MEMS measurement device comprises a three-axis accelerometer, a three-axis gyroscope and a pressure sensor. In some embodiments, although not shown, method 1600 can also include providing a magnetometer at the MEMS measurement device.

In some embodiments, although not shown, method 1600 can also include providing a port disposed through the substrate and configured to receive the acoustic waves. In some embodiments, a lid can be mounted to the first surface of the substrate to form a package enclosing the MEMS microphone, the integrated circuit and the MEMS measurement device.

In some embodiments, although not shown, in lieu of providing the port through the lid, method 1600 can include providing a port through the lid. The port can be positioned to enable acoustic waves to be sensed by the MEMS microphone and at least the pressure sensor of the MEMS measurement device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A micro electro-mechanical system (MEMS) device, comprising:
a substrate having a first surface and a second surface, wherein the first surface is exposed to an environment outside the MEMS device;

a MEMS microphone disposed at a first location on the second surface of the substrate and having a diaphragm positioned such that acoustic waves received at the MEMS microphone are incident on the diaphragm;

an integrated circuit disposed at a second location on the second surface of the substrate, wherein the integrated circuit is electrically coupled to the MEMS microphone; and a MEMS measurement device disposed at a third location, wherein the first location and the second location are distinct locations on the second surface of the substrate, wherein the MEMS microphone is located distinct from the integrated circuit on the second surface of the substrate, and wherein the MEMS measurement device comprises a motion sensor.

2. The MEMS device of claim 1, wherein the integrated circuit is positioned on the second surface.

3. The MEMS device of claim 1, wherein the integrated circuit and the MEMS measurement device are stacked.

4. The MEMS device of claim 1, wherein the substrate comprises a first port disposed through the substrate and configured to receive the acoustic waves.

5. The MEMS device of claim 1, further comprising:
a lid mounted to the second surface of the substrate and forming a package enclosing the MEMS microphone, the integrated circuit and the MEMS measurement device.

6. The MEMS device of claim 1, further comprising a processor disposed on the second surface of the substrate.

7. The MEMS device of claim 6, wherein the processor is disposed between the integrated circuit and the substrate.

8. The MEMS device of claim 1, wherein the MEMS measurement device further comprises a magnetometer.

9. The MEMS device of claim 1, further comprising a pressure sensor.

10. The MEMS device of claim 9, wherein the MEMS microphone is configured to perform detection of the acoustic waves and wherein the MEMS measurement device is configured to perform pressure sensing.

11. The MEMS device of claim 5, wherein the lid is comprised of metal.

12. The MEMS device of claim 1, wherein the motion sensor is at least one of a gyroscope or an accelerometer.

13. A micro electro-mechanical system (MEMS) device, comprising:

a package having a port through the package and exposed to an environment;

a MEMS microphone disposed at a first location on a surface within the package, wherein the MEMS microphone includes a diaphragm positioned such that acoustic waves received at the port of the package are incident on the diaphragm; and a MEMS detection structure enclosed within the package, wherein the MEMS detection structure comprises:
a processor provided at a second location on the surface within the package;
an integrated circuit coupled to the processor; and
a MEMS measurement device coupled to the integrated circuit, wherein the MEMS measurement device comprises a three-axis accelerometer, a three-axis gyroscope and a pressure sensor, wherein the first location and the second location are distinct locations on the surface within the package, and wherein the MEMS microphone is located distinct from the processor on the surface within the package.

14. The MEMS device of claim 13, wherein the MEMS measurement device further comprises a magnetometer.

15. The MEMS device of claim 13, wherein the package comprises more than one laminate substrate.

16. A micro electro-mechanical system (MEMS) device, comprising:

a substrate having a first surface and a second surface, wherein the first surface is exposed to an environment outside the MEMS device;

a MEMS microphone disposed at a first location on the second surface of the substrate and having a diaphragm positioned such that acoustic waves received at the MEMS microphone are incident on the diaphragm;

an integrated circuit disposed at a second location on the second surface of the substrate, wherein the integrated circuit is electrically coupled to the MEMS microphone; and a MEMS measurement device disposed at a third location, wherein the MEMS measurement device comprises a pressure sensor, wherein the first location and the second location are distinct locations on the second surface of the substrate, and wherein the MEMS microphone is located distinct from the integrated circuit on the second surface of the substrate.

* * * * *